United States Patent
Fiedler et al.

[11] Patent Number: 5,955,978
[45] Date of Patent: Sep. 21, 1999

[54] A/D CONVERTER WITH AUTO-ZEROED LATCHING COMPARATOR AND METHOD

[75] Inventors: Alan S. Fiedler, Minneapolis; Brett D. Hardy, Eden Prairie, both of Minn.

[73] Assignee: LSI Logic Corporation

[21] Appl. No.: 08/925,041

[22] Filed: Sep. 8, 1997

[51] Int. Cl.[6] .................................................. H03M 1/10
[52] U.S. Cl. .......................................................... 341/118
[58] Field of Search .................................... 341/118, 120

[56] References Cited

U.S. PATENT DOCUMENTS

| | | | |
|---|---|---|---|
| 4,539,551 | 9/1985 | Fujita et al. | 341/118 |
| 4,542,354 | 9/1985 | Robinton et al. | 341/118 |
| 4,799,041 | 1/1989 | Layton | 341/118 |
| 5,262,779 | 11/1993 | Sauer | 341/118 |
| 5,745,060 | 4/1998 | McCartney et al. | 341/120 |

*Primary Examiner*—Howard L. Williams
*Attorney, Agent, or Firm*—Westman, Champlin & Kelly, P.A.

[57] ABSTRACT

An A/D converter has an auto-zeroed latching comparator with an input offset voltage. The latching comparator is repetitively switched between an offset adjustment mode and a conversion mode. When the comparator is in the offset adjustment mode, the comparator compares the reference voltage to itself and generates an offset measurement output based on the comparison. A feedback circuit adjusts the input offset voltage based on the offset measurement output. When the comparator is in the conversion mode, the comparator compares the input signal to the reference voltage and generates the digital output signal based on the comparison.

19 Claims, 6 Drawing Sheets

A/D CONVERTER WITH AUTO-ZEROED LATCHING COMPARATOR AND METHOD

CROSS-REFERENCE TO RELATED APPLICATION

Cross-reference is hereby made to co-pending application U.S. Ser. No. 08/882,861, entitled "Latching Comparator With Input Offset Adjustment," which was filed on Jun. 6, 1997 and is assigned to the same assignee as the present application.

BACKGROUND OF THE INVENTION

The present invention relates to very high speed analog-to-digital (A/D) converters and, in particular, to an A/D converter having an auto-zeroed latching comparator.

High speed A/D converters commonly use an architecture known as a flash architecture. The simplest type of N-bit flash A/D converter requires $2^N$ comparators. These comparators are usually of a sampling type, in which a voltage comparison is made between the comparator's differential inputs upon the transition of a clock input. Good linearity performance of the A/D converter requires that the input offset voltage of each sampling comparator be minimized.

A typical method of nulling the input offset voltage involves measuring and storing the offset voltage on a sampling capacitor, followed by inserting the capacitor in series with the signal path. This method requires specialized circuitry and a certain sequence of operations such that the measured voltage exactly cancels the offset voltage of the comparator. A difficulty with this method is that the sampling capacitor results in a higher comparator input capacitance due to parasitic coupling of the sampling capacitor to the integrated circuit substrate on which the comparator is fabricated. Also, the sampling capacitor and the specialized track/hold and offset cancellation circuitry consume a relatively large area on the integrated circuit.

SUMMARY OF THE INVENTION

The A/D converter of the present invention has an auto-zeroed latching comparator with an input offset voltage. In one aspect of the present invention, the latching comparator is repetitively switched between an offset adjustment mode and a conversion mode. When the comparator is in the offset adjustment mode, the comparator compares the reference voltage to itself and generates an offset measurement output based on the comparison. A feedback circuit adjusts the input offset voltage based on the offset measurement output. When the comparator is in the conversion mode, the comparator compares the input signal to the reference voltage and generates the digital output signal based on the comparison.

In another aspect of the present invention, the analog-to-digital (A/D) converter includes an analog input, a reference voltage input and a digital output. A first latching comparator has a first comparator input which is coupled to the reference voltage input, a second comparator input, a first input offset adjustment input and a first comparator output which is coupled to the digital output. A first switch circuit is coupled between the second comparator input, the reference voltage input and the analog input and has a first switch state in which the second comparator input is coupled to the reference voltage input and a second switch state in which the second comparator input is coupled to the analog input. A first feedback circuit is coupled between the first comparator output and the first input offset adjustment input. The first feedback circuit is enabled when first switch circuit is in the first switch state and is disabled when first switch circuit is in the second switch state.

DETAILED DESCRIPTION OF THE PREFERRED EMBODIMENTS

Figure 1:
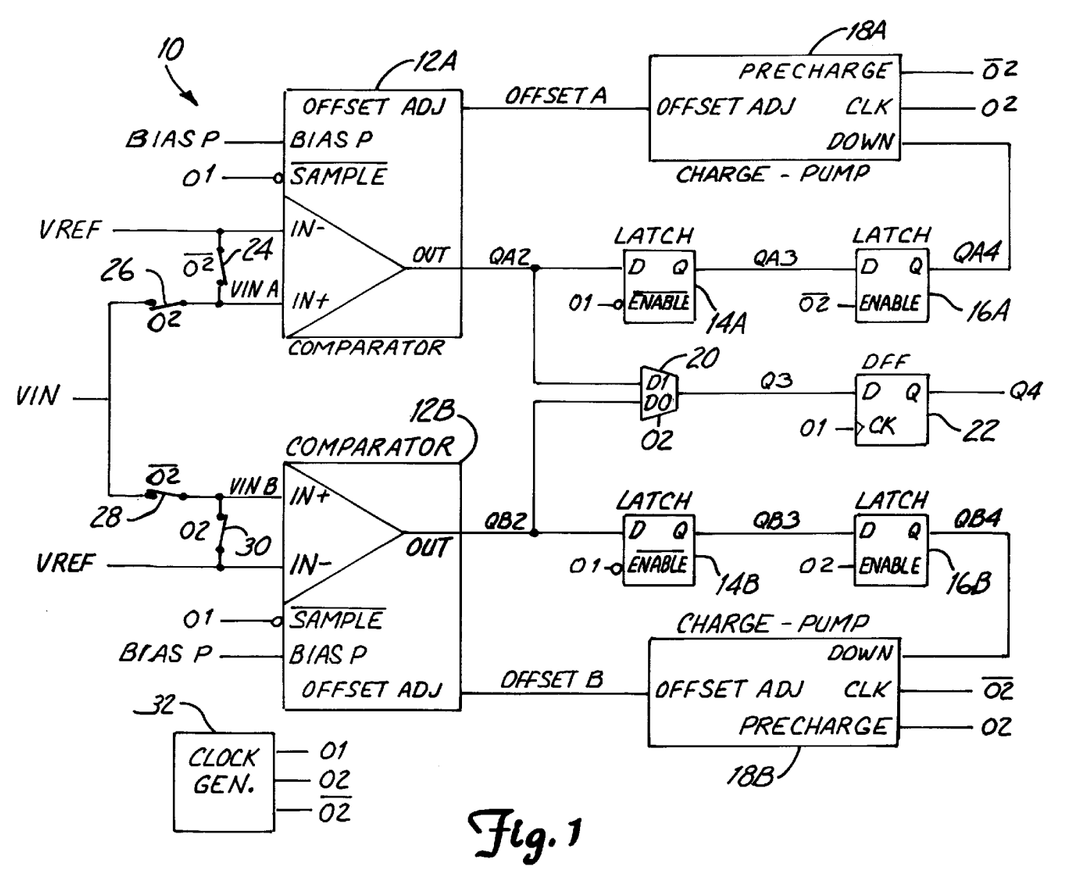
FIG. 1 is a block diagram of a one-bit A/D converter with input offset cancellation according to the present invention.

FIG. 1 is a block diagram of a one-bit A/D converter with two auto-zeroed latching comparators according to one embodiment of the present invention. A/D converter 10 includes latching comparators 12A and 12B, D-type latches 14A, 14B, 16A and 16B, charge pumps 18A and 18B, multiplexer 20, D-type flip-flop 22, a first switching circuit formed by analog switches 24 and 26, a second switching circuit formed by analog switches 28 and 30, and clock generator 32.

Clock generator 32 generates clock signal φ1 and complementary clock signals φ2 and $\overline{\phi2}$ for controlling the operating sequence of the various elements of A/D converter 10. Clock signal φ1 controls latching comparators 12A and 12B, latches 14A and 14B and flip-flop 22. Complementary clock signals φ2 and $\overline{\phi2}$ control analog switches 24, 26, 28 and 30, latches 16A and 16B, charge pumps 18A and 18B and multiplexer 20. In a preferred embodiment, clock signals φ2 and $\overline{\phi2}$ cross over one another at a logic low level for proper operation of the analog switches and charge pumps 18A and 18B.

Each latching comparator 12A and 12B includes a pair of differential inputs IN+ and IN−, an output OUT, an offset adjustment input OFFSETADJ, a bias input BIASP and a sample input $\overline{\text{SAMPLE}}$. Bias input BIASP is coupled to a bias voltage generator (not shown) at bias node BIASP for biasing a tail current source within each comparator. Sample input $\overline{\text{SAMPLE}}$ of each comparator is coupled to clock signal φ1. Input IN+ of latching comparator 12A is coupled to input VIN through analog switch 26 and to reference voltage input VREF through analog switch 24. Switches 24 and 26 have control terminals coupled to clock signals $\overline{\phi2}$ and φ2, respectively. Input IN− of latching comparator 12A is coupled to reference voltage input VREF. Output OUT of latching comparator 12A is coupled to the data input of latch 14A and to one of the inputs of multiplexer 20, at node QA2.

Latch 14A has an enable input coupled to clock signal φ1 and a data output coupled to the data input of latch 16A, at node QA3. Latch 16A has an enable input coupled to clock signal $\overline{\phi2}$ and a data output coupled to node QA4. Charge pump 18A has a pump direction control input DOWN coupled to node QA4, a clock input CLK coupled to clock signal φ2, a precharge input PRECHARGE coupled to clock signal $\overline{\phi 2}$ and an offset adjustment output OFFSETADJ coupled to offset adjustment input OFFSETADJ of latching comparator 12A, at node OFFSETA.

Similarly, input IN+ of latching comparator 12B is coupled to input VIN through analog switch 28 and to reference voltage input VREF through analog switch 30. Switches 28 and 30 have control terminals coupled to clock signals $\overline{\phi 2}$ and $\phi 2$, respectively. Input IN– of latching comparator 12B is coupled to reference voltage input VREF. Output OUT of latching comparator 12B is coupled to the data input of latch 14B and to the other input of multiplexer 20, at node QB2.

Latch 14B has an enable input coupled to clock signal $\phi 1$ and a data output coupled to the data input of latch 16B, at node QB3. Latch 16B has an enable input coupled to clock signal $\phi 2$ and a data output coupled to node QB4. Charge pump 18B has a pump direction control input DOWN coupled to node QB4, a clock input CLK coupled to clock signal $\overline{\phi 2}$, a precharge input PRECHARGE coupled to clock signal $\phi 2$ and an offset adjustment output OFFSETADJ coupled to offset adjustment input OFFSETADJ of latching comparator 12B, at node OFFSETB. The output of multiplexer 20 is coupled to the data input of flip-flop 22, at node Q3. The data output of flip-flop 22 is coupled to A/D output Q4.

Referring to latching comparator 12A, the clock signals generated by clock generator 32 operate latching comparator 12A so that it alternates between an offset adjustment mode in which the reference voltage on reference voltage input VREF is compared with itself on node VINA and a conversion mode in which the reference voltage on reference voltage input VREF is compared with the input signal on node VINA. Based on the results of the comparison of the reference voltage to itself on every other sampling cycle, the voltage that is applied to the offset adjustment input OFFSETADJ of latching comparator 12A is adjusted incrementally until the input offset voltage of latching comparator 12A becomes vanishingly small. With a zero input offset voltage, latching comparator 12A is equally likely to regenerate into a logic high state or a logic low state when the inputs IN+ and IN– have the same voltage.

This toggling between offset adjustment and input conversion results in an input signal sample rate of ½ the raw sample rate at which latching comparator 12A must operate. To make up for this loss in sampling bandwidth, the circuitry is duplicated through latching comparator 12B, latches 14B and 16B and charge pump 18B. When latching comparator 12A is sampling the input signal, latching comparator 12B samples the reference voltage so as to measure its input offset voltage. On the next cycle, the operation will reverse, with comparator 12B sampling the input signal and latching comparator 12A sampling the reference voltage so as to measure its input offset voltage. The results of the converted input signal on nodes QA3 and QB3 are alternately applied to flip-flop 22 and A/D output Q4 through multiplexer 20.

Figure 2:
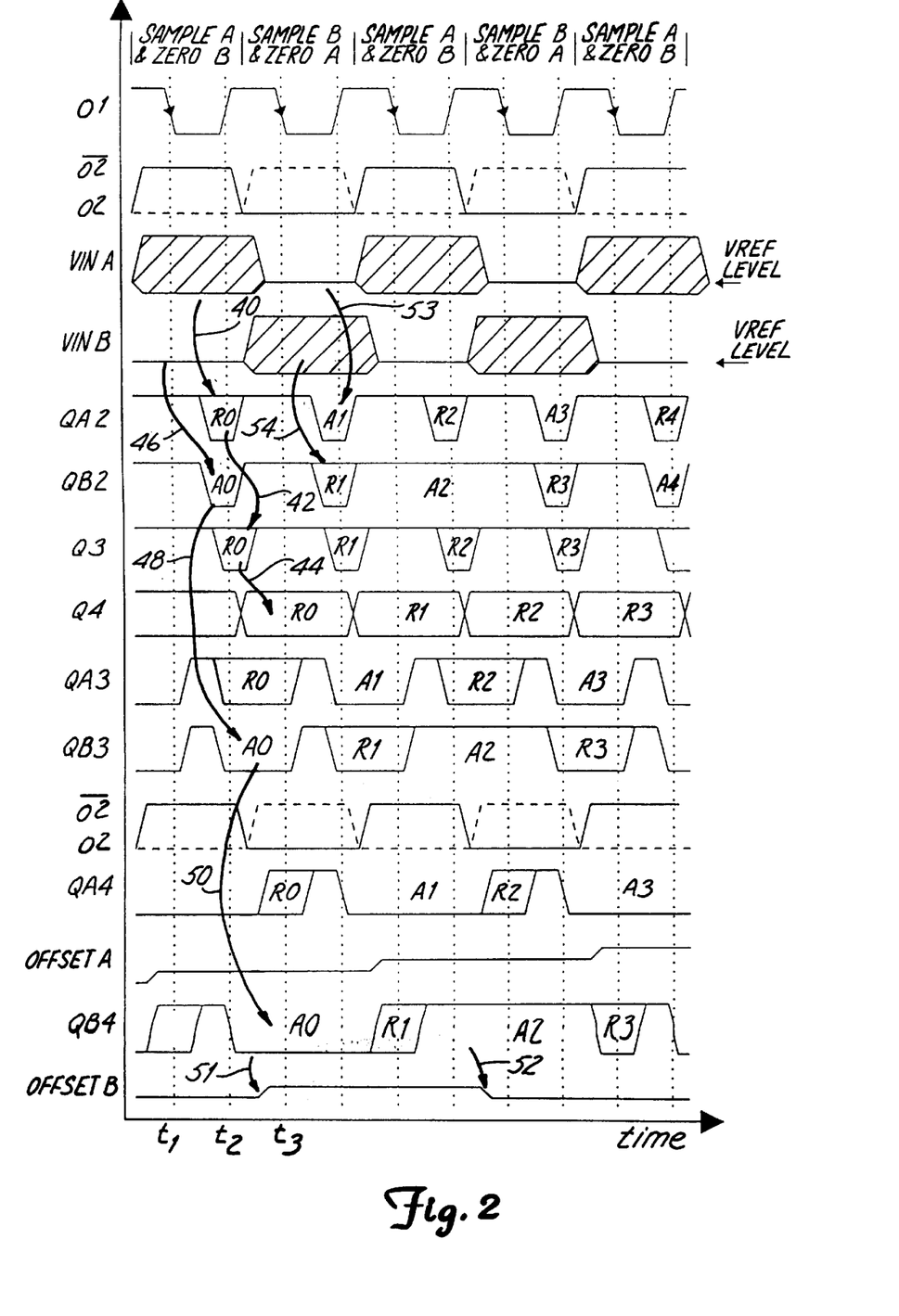
FIG. 2 is a waveform diagram which illustrates various nodes of the converter when alternating between a conversion mode and an offset adjustment mode.

The sequential operation of A/D converter 10 is shown in more detail in FIG. 2. FIG. 2 is a waveform diagram illustrating various nodes in A/D converter 10 as latching comparators 12A and 12B alternate between the offset adjustment mode and the conversion mode. On the rising edge of clock signal $\phi 1$, latching comparators 12A and 12B are reset into a balanced state, as described in more detail below with reference to FIGS. 4–7. Immediately after the rising edge of clock signal $\phi 1$, clock signals $\phi 2$ and $\overline{\phi 2}$ transition (crossing over low), setting analog switches 24, 26, 28 and 30 to their proper states. A sample sequence begins at time $t_1$ with the falling edge of clock signal $\phi 1$. $\phi 2$ is high and $\overline{\phi 2}$ (shown as dashed line) is low such that latching comparator 12A is in the conversion mode and latching comparator 12B is in the offset adjustment mode. Latching comparators 12A and 12B are released from their balanced state on the falling edge of $\phi 1$, and their outputs OUT regenerate into a zero state or a one state, depending on the differential voltage at differential inputs IN+ and IN–. Latching comparator 12A compares the input signal, labeled "DATA", on node VINA with the reference voltage level VREF and the result "R0" is valid on node QA2 shortly after the falling edge of clock $\phi 1$, as shown by arrow 40.

With clock signal $\phi 2$ high, multiplexer 20 passes the result R0 from node QA2 to node Q3, as shown by arrow 42. Flip-flop 22 passes the result R0 from node Q3 to node Q4 at the next rising edge of clock signal $\phi 1$, at time $t_2$, as shown by arrow 44. Since clock signal $\phi 1$ is low, latch 14A is open and the result R0 is passed to node QA3. On the rising edge of clock signal $\phi 1$, at time $t_2$, latching comparator 12A is reset, and its output at node QA2 is forced high. With clock signal $\phi 1$ high, latch 14A closes to extend the valid state of result R0 on node QA3. However, low level clock signal $\overline{\phi 2}$ is low and therefore disables latch 16A and the feedback path through charge pump 18A.

Referring to latching comparator 12B, at time $t_1$, switch 28 is open and switch 30 is closed. At the falling edge of $\phi 1$, latching comparator 12B compares the reference voltage at input IN– with the reference voltage at input IN+ (VINB). Shortly thereafter, the offset measurement result A0 becomes valid at node QB2, as shown by arrow 46. Since clock signal $\phi 1$ is low, latch 14B is open and passes the result A0 from node QB2 to node QB3, as shown by arrow 48. At the rising edge of clock signal $\phi 1$, at time $t_2$, latch 14B closes and extends the valid state of result A0 on node QB3. Since clock signal $\phi 2$ remains high, latch 16B is enabled and passes A0 from node QB3 to node QB4, as shown by arrow 50. On the falling edge of clock signal $\phi 2$, just after time $t_2$, latch 16B closes and extends the valid state of result A0 on node QB4.

The result A0 is applied to the DOWN input of charge pump 18B. Since the result A0 is zero, the DOWN input of charge pump 18B is de-asserted. On next the rising edge of $\overline{\phi 2}$, charge pump 18B "pumps" a small amount of charge onto offset adjustment node OFFSETB, as shown by arrow 51. If the result were a one, such as result A2, charge pump 18B would pump a small amount of charge off of node OFFSETB, as shown by arrow 52. Charge pumps 18A and 18B form feedback circuits that are enabled when the corresponding latching comparator is in the offset adjustment mode and are disabled when the corresponding latching comparator is in the conversion mode. Latching comparator 12B receives the voltage on node OFFSETB, and adjusts its input offset voltage as a function of the voltage level, as described in more detail below with reference to FIGS. 4–7.

The sequence repeats with a new sampling cycle at time $t_3$, with the next falling edge of clock signal $\phi 1$. In the next sampling cycle however, clock signal $\phi 2$ is low and clock signal $\overline{\phi 2}$ is high. Latching comparator 12A is in the offset adjustment mode and latching comparator 12B is in the conversion mode. Latching comparator 12A compares the reference voltage at input IN– with itself at input IN+ and passes the offset measurement result "A1" to node QA2, as shown by arrow 53. At the same time, latching comparator 12B compares the input signal on input IN+ with the reference voltage on input IN– and passes the conversion result R1 to node QB2, as shown by arrow 54. The remainder of the sequence is similar to that discussed above.

Latching comparators 12A and 12B continue to alternate between the offset adjustment mode and the conversion mode in subsequent sampling cycles so that charge pumps 18A and 18B continue to adjust the voltages on offset adjustment nodes OFFSETA and OFFSETB in discrete increments until each latching comparator is equally likely to latch a zero result and a one result when the voltages applied to inputs IN+ and IN– are equal. When this result is achieved, the comparator's input offset voltage is effectively nulled to zero. In an alternative embodiment, latching comparators 12A and 12B are each operated in the conversion mode for several sampling cycles before being switched to the offset adjustment mode. Various sequence alternatives can be used.

The dynamic adjustment of the voltages on offset adjustment nodes OFFSETA and OFFSETB not only cancels static input offset, but also cancels comparator offsets due to transistor thermal and 1/f noise in a bandwidth lower than the adjustment frequency. This is especially beneficial when using minimum semiconductor device sizes since the magnitude of these noise sources increases with decreasing transistor size.

In another alternative embodiment, A/D converter 10 has only one latching comparator, such as comparator 12A. Comparator 12B and its associated elements, latches 14B and 16B, charge pump 18B and multiplexer 20, are removed. Flip-flop 22 is triggered by the rising edge of $\overline{\phi 2}$. Also, the one-bit A/D converter shown in FIG. 1 can be expanded in other alternative embodiments to an N-bit converter. A one-bit converter was shown for the sake of simplicity.

Figure 3:
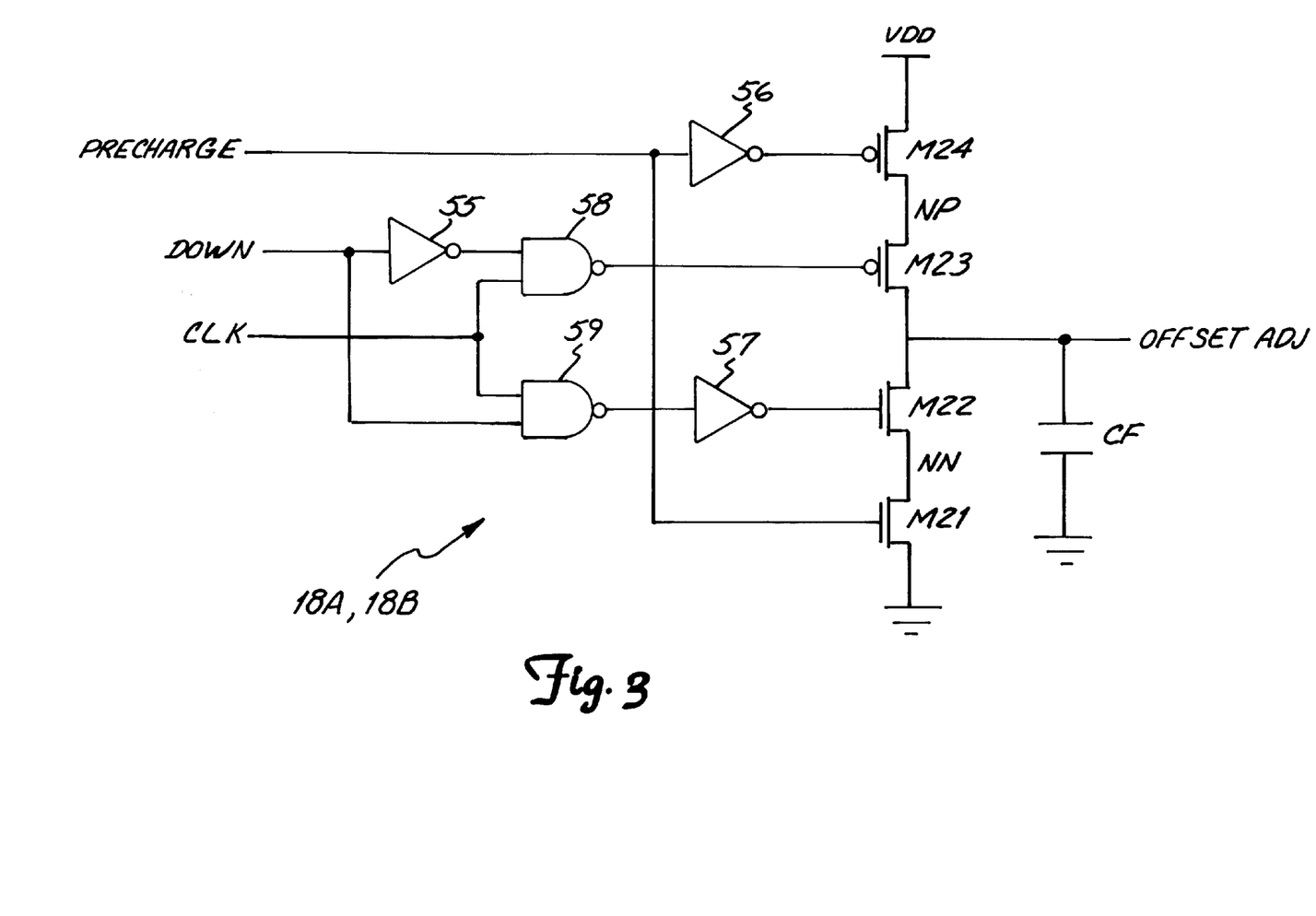
FIG. 3 is a schematic diagram of a charge pump within the converter shown in FIG. 1.

FIG. 3 is a schematic diagram of one of the charge pumps 18A and 18B. Charge pumps 18A and 18B each include inverters 55, 56 and 57, NAND gates 58 and 59, transistors M21–M24 and filter capacitor CF. With clock input CLK low, precharge input PRECHARGE is high, turning on transistors M24 and M21. The small parasitic capacitance at node NP is then charged to the voltage on supply terminal VDD, and the small parasitic capacitance at node NN is charged to the voltage on ground terminal GND. PRECHARGE is then de-asserted low, turning off transistors M24 and M21. After PRECHARGE goes low, clock input CLK goes high.

Depending on the logic state on DOWN, either transistor M23 or M22 will turn on, transferring the charge at node NP or node NN onto filter capacitor CF. If DOWN is high, the voltage on offset adjustment output OFFSETADJ will decrease according to the relation $$\Delta V \cong \left(\frac{C_{NN}}{C_F}\right) \cdot V_{OFFSETADJ} \qquad \text{Eq. 1}$$

where, $C_{NN}$ is the parasitic capacitance at node NN, CF is the capacitance of filter capacitor CF and $V_{OFFSETADJ}$ is the voltage on offset adjustment output OFFSETADJ. If DOWN is low, the voltage on offset adjustment output OFFSETADJ will increase according to the relation $$\Delta V \cong \left(\frac{C_{NP}}{C_F}\right) \cdot (V_{DD} - V_{OFFSETADJ}) \qquad \text{Eq. 2}$$

where $C_{NP}$ is the parasitic capacitance at node NP and $V_{DD}$ is the voltage on supply terminal VDD. The voltage on offset adjustment output OFFSETADJ therefore increases or decreases incrementally during each sampling cycle in which the charge pump is enabled.

A charge pump is only one example of a feedback circuit that can be used to adjust the voltage or current on the offset adjustment input of each latching comparator based on the result of the offset adjustment measurement. Other voltage or current adjusting circuits can also be used.

Figure 4:
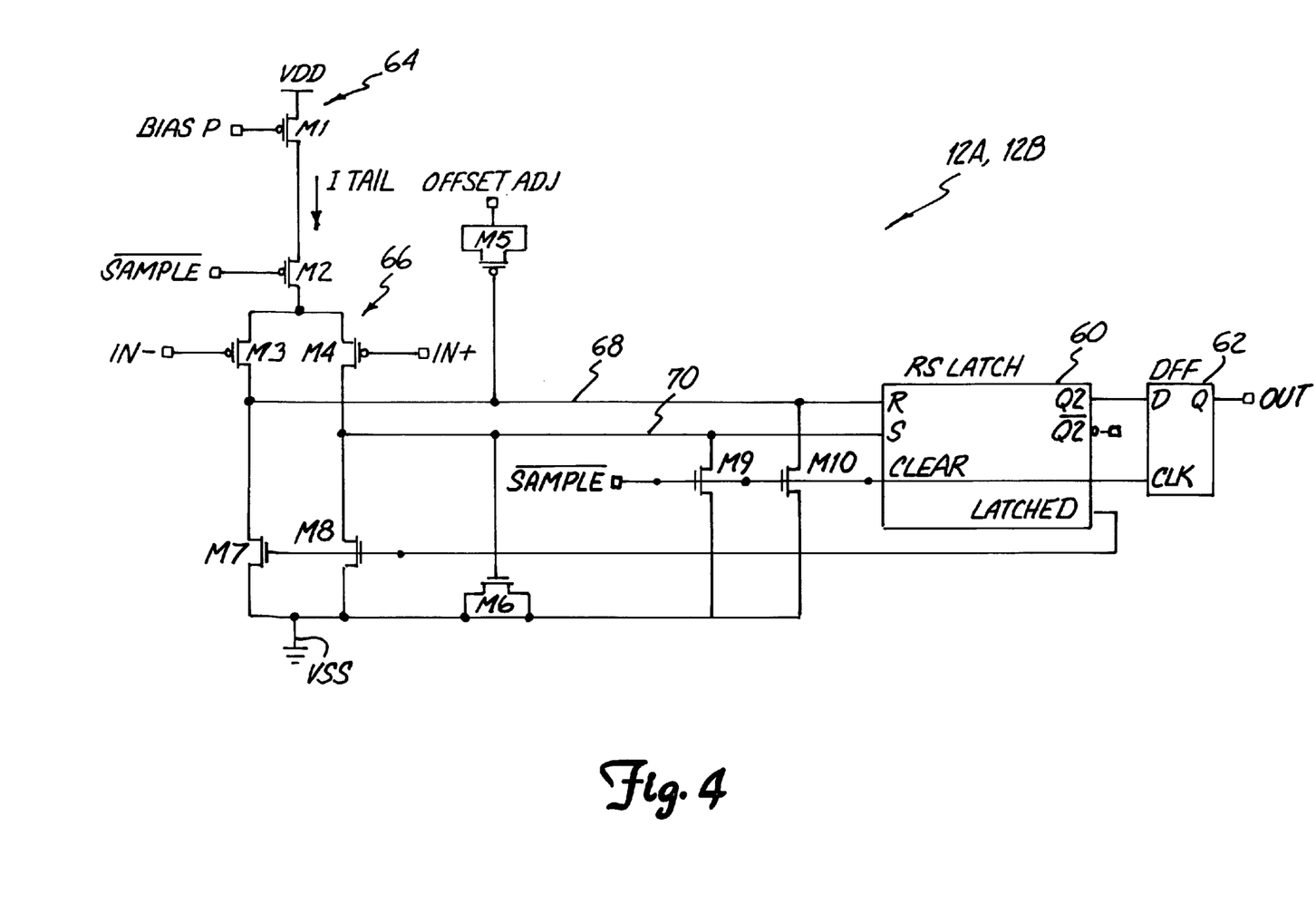
FIG. 4 is a schematic diagram of a latching comparator within the converter shown in FIG. 1.

FIG. 4 is a schematic diagram of one of the latching comparators 12A,12B according to one embodiment of the present invention. Latching comparators 12A and 12B each include P-channel transistors M1–M5, N-channel transistors M6–M10, RS latch 60 and D-type flip-flop 62. Transistor M1 is coupled between voltage supply terminal VDD and the source of transistor M2. The gate of transistor M1 is coupled to bias input BIASP for sourcing a tail current ITAIL into the source of transistor M2 as a function of the voltage on bias input BIASP.

Transistor M2 has a gate coupled to sample input $\overline{\text{SAMPLE}}$, a source coupled to the drain of transistor M1 and a drain coupled to the sources of transistors M3 and M4. When $\overline{\text{SAMPLE}}$ goes low, transistor M2 turns on and applies tail current ITAIL to the sources of transistors M3 and M4.

Transistors M3 and M4 are coupled together to form differential pair 66. Transistor M3 has a gate coupled to comparator input IN– and a drain coupled to current integration node 68. Transistor M4 has a gate coupled to comparator input IN+ and a drain coupled to current integration node 70. Transistors M3 and M4 steer the tail current ITAIL onto current integration nodes 68 and 70 based on the relative voltages on comparator inputs IN+ and IN–, which are referred to as $V_{IN+}$ and $V_{IN-}$, respectively.

RS latch 60 includes reset input R, set input S, clear input CLEAR, complementary outputs Q2 and $\overline{Q2}$ and latched indicator output LATCHED. Reset input R is coupled to current integration node 68. Set input S is coupled to current integration node 70. Clear input CLEAR is coupled to comparator sample input $\overline{\text{SAMPLE}}$. Output Q2 is coupled to data input D of D-type flip-flop 62. Latched indicator output LATCHED is coupled to the gates of transistors M7 and M8.

On the falling edge of $\overline{\text{SAMPLE}}$, the tail current ITAIL is steered through transistors M3 and M4 and integrated onto nodes 68 and 70. RS latch 60 then regenerates to hold a zero (a logic low state) or a one (a logic high state) on output Q2, depending on whether reset input R or set input S reaches the logic threshold of RS latch 60 first. D-type flip-flop 62 has a data input D coupled to RS latch output Q2, an output Q coupled to comparator output OUT and a clock input CLK coupled to sample input $\overline{\text{SAMPLE}}$. D-type flip-flop 62 clocks the logic state on RS latch output Q2 to comparator output OUT on the rising edge of the sample input $\overline{\text{SAMPLE}}$.

Once RS latch 60 has regenerated and either latch output Q2 or $\overline{Q2}$ has switched from 0 to 1, latched indicator output LATCHED goes high, turning on transistors M7 and M8. Transistors M7 and M8 are coupled between current integration nodes 68 and 70, respectively, and supply terminal VSS. When latched indicator output LATCHED is active in the logic high state, transistors M7 and M8 pull the rising voltages on nodes 68 and 70 low toward supply terminal VSS, which terminates integration of the tail current on nodes 68 and 70. This helps reduce "kickback" of the voltages on nodes 68 and 70 onto comparator inputs IN+ and IN–.

Transistors M9 and M10 are coupled between nodes 70 and 68, respectively, and supply terminal VSS. The gates of transistors M9 and M10 are coupled to sample input $\overline{\text{SAMPLE}}$. When $\overline{\text{SAMPLE}}$ is in an inactive, logic high state, transistors M9 and M10 are on and pull the voltages on nodes 68 and 70 toward the voltage on supply terminal VSS. This maintains the voltages on nodes 68 and 70 in a reset and balanced state until the next comparison when $\overline{\text{SAMPLE}}$ transitions to a logic low state.

Mismatches in transistor pairs M3–M4 and imbalances in the capacitive loading on reset input R and set input S result in an input-referred comparator offset voltage. With $V_{IN+}=V_{IN-}$, latching comparator 12A,12B will typically favor latching to either a zero state or a one state. Transistor M5 allows for adjustment of the capacitance on integration node 68 relative to the capacitance on integration node 70 until latching comparator 12A,12B will be equally likely to latch into a zero state or a one state. Transistor M5 is a voltage-controlled field effect transistor (FET) capacitor having a gate coupled to the current integration node 68 and a source and drain coupled to offset adjustment input OFFSETADJ. Transistor M6 is a depletion-mode FET capacitor and has a gate coupled to current integration node 70 and a source and drain coupled to supply terminal VSS. Adjusting the voltage $V_{OFFSETADJ}$ on offset adjustment input OFFSETADJ adjusts the capacitive loading and thus the integration time constant on node 68 relative to the capacitive loading and integration time constant on node 70. By adjusting one integration time constant relative to the other integration time constant until latching comparator 12A,12B is equally likely to latch a zero state or a one state when $V_{IN+}=V_{IN-}$, the comparator's input offset voltage can be completely nulled out.

Figure 5:
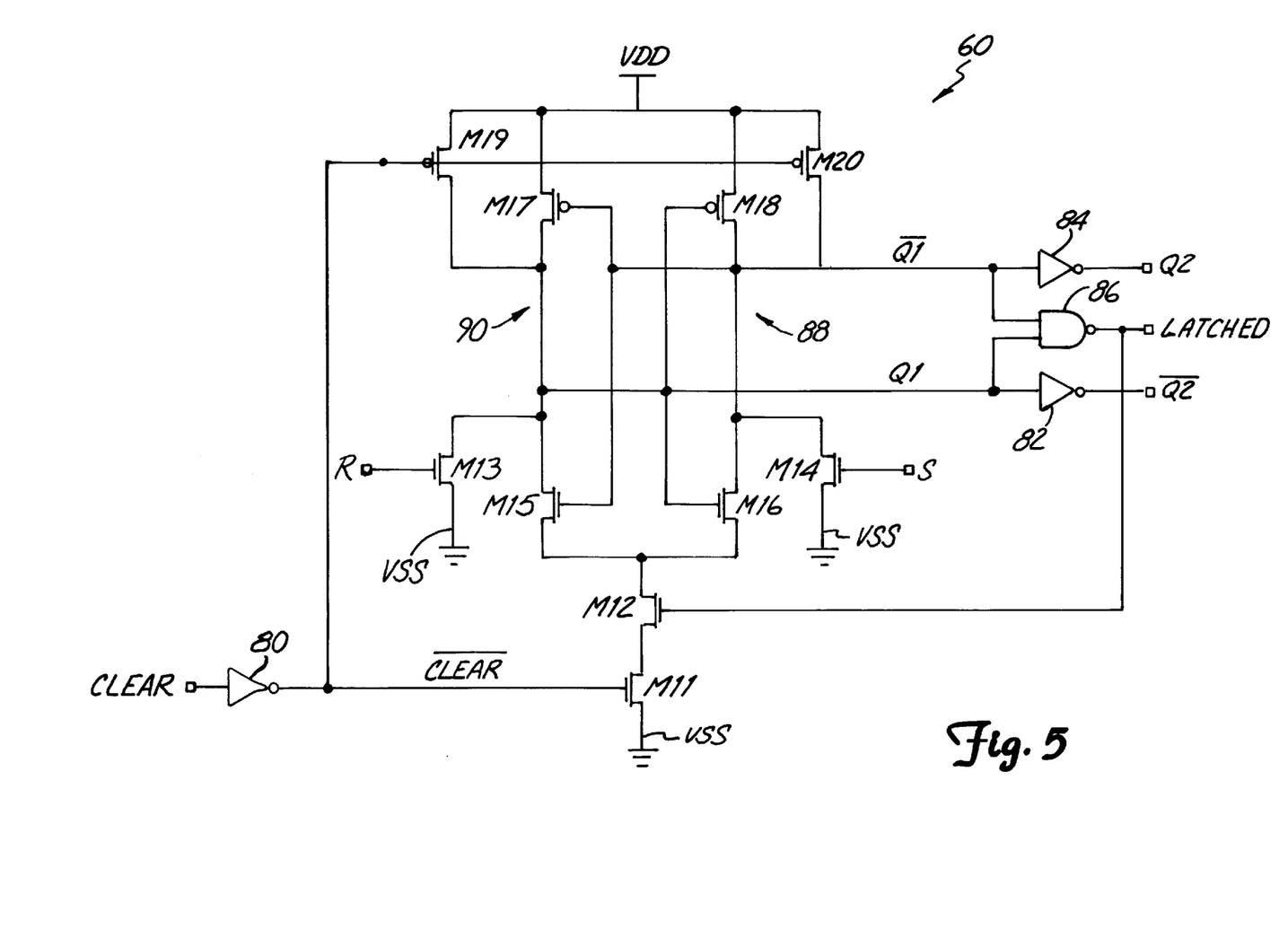
FIG. 5 is a schematic diagram of an RS latch within the latching comparator shown in FIG. 4.

FIG. 5 is a schematic diagram of RS latch 60. RS latch 60 includes N-channel transistors M11–M16, P-channel transistors M17–M20, inverters 80, 82 and 84 and NAND gate 86. Transistor M13 has a gate coupled to reset input R, a source coupled to supply terminal VSS and a drain coupled to internal latch node Q1. Similarly, transistor M14 has a gate coupled to set input S, a source coupled to supply terminal VSS and a drain coupled to internal latch node $\overline{Q1}$. Transistors M13 and M14 receive the rising voltages on reset input R and set input S. Depending upon which of the inputs R or S reaches the N-channel threshold voltage first, either transistor M13 or transistor M14 will turn on and pull the respective internal latch node Q1 or $\overline{Q1}$ low.

Transistors M15–M18 form a pair of cross-coupled inverters 88 and 90 between internal latch nodes Q1 and $\overline{Q1}$. Transistors M16 and M18 form inverter 88, which has an input coupled to node Q1 and an output coupled to node $\overline{Q1}$. Transistor M16 has a gate coupled to the gate of transistor M18, a source coupled to the drain of transistor M12 and a drain coupled to the drain of transistor M18. Transistor M18 has a source coupled to supply terminal VDD. Transistors M15 and M17 form inverter 90, which has an input coupled to node $\overline{Q1}$ and an output coupled to node Q1. Transistor M15 has a gate coupled to the gate of transistor M17, a source coupled to the drain of transistor M12 and a drain coupled to the drain of transistor M17. Transistor M17 has a source coupled to supply terminal VDD.

Nodes Q1 and $\overline{Q1}$ are coupled to latch outputs $\overline{Q2}$ and Q2, respectively, through inverters 82 and 84. NAND gate 86 is coupled between nodes Q1 and $\overline{Q1}$ and latched indicator output LATCHED.

CLEAR is coupled to the input of inverter 80. The output of inverter 80 is coupled to the gates of transistors M11, M19 and M20. Transistors M11 and M12 are pull-down transistors which are coupled in series between the sources of transistors M15 and M16 and supply terminal VSS. The gate of transistor M12 is coupled to the output of NAND gate 86. Transistors M19 and M20 are pull-up transistors which are coupled between supply terminal VDD and nodes Q1 and $\overline{Q1}$, respectively.

If reset input R reaches the threshold voltage $V_{TH,M13}$ of transistor M13 before set input S reaches the threshold voltage $V_{TH,M14}$ of transistor M14, then node Q1 will switch low before node $\overline{Q1}$. Upon node Q1 switching low, latched indicator output LATCHED will switch to an active high state. Transistor M12 turns on, pulling the sources of transistors M15 and M16 low toward supply terminal VSS through transistor M11, which reinforces the latched state by holding transistors M15 and M18 on and transistors M16 and M17 off.

At the rising edge of $\overline{\text{SAMPLE}}$, CLEAR goes high. The output of inverter 80 goes low, which turns off transistor M11 and turns on transistors M19 and M20. Transistor M11 decouples transistor M12 from supply terminal VSS which allows transistors M19 and M20 to pull nodes Q1 and $\overline{Q1}$ high toward the voltage on supply terminal VDD. This resets the latch by balancing nodes Q1 and $\overline{Q1}$ for the next comparison at the next falling edge of $\overline{\text{SAMPLE}}$. Transistor M11 may be removed in alternative embodiments if transistors M19 and M20 are large enough to pull nodes Q1 and $\overline{Q1}$ sufficiently high so as to force LATCHED low, shutting off transistor M12.

Figure 6:
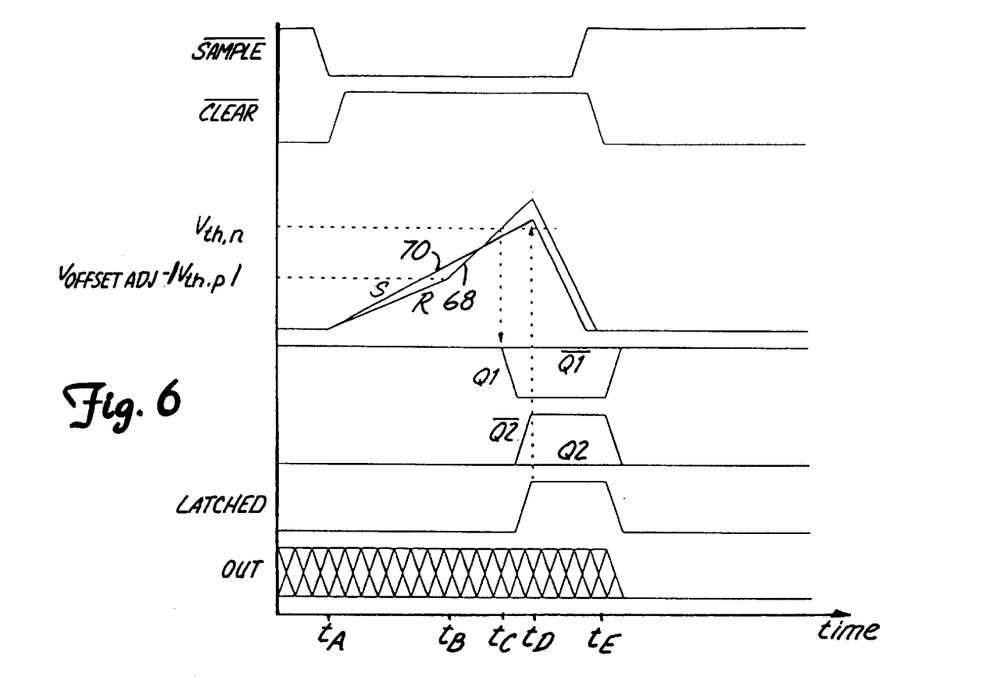
FIGS. 6 and 7 are waveform diagrams which illustrate various nodes of the latching comparator when an offset adjustment voltage applied to the latching comparator is set too low and too high, respectively.
Figure 7:
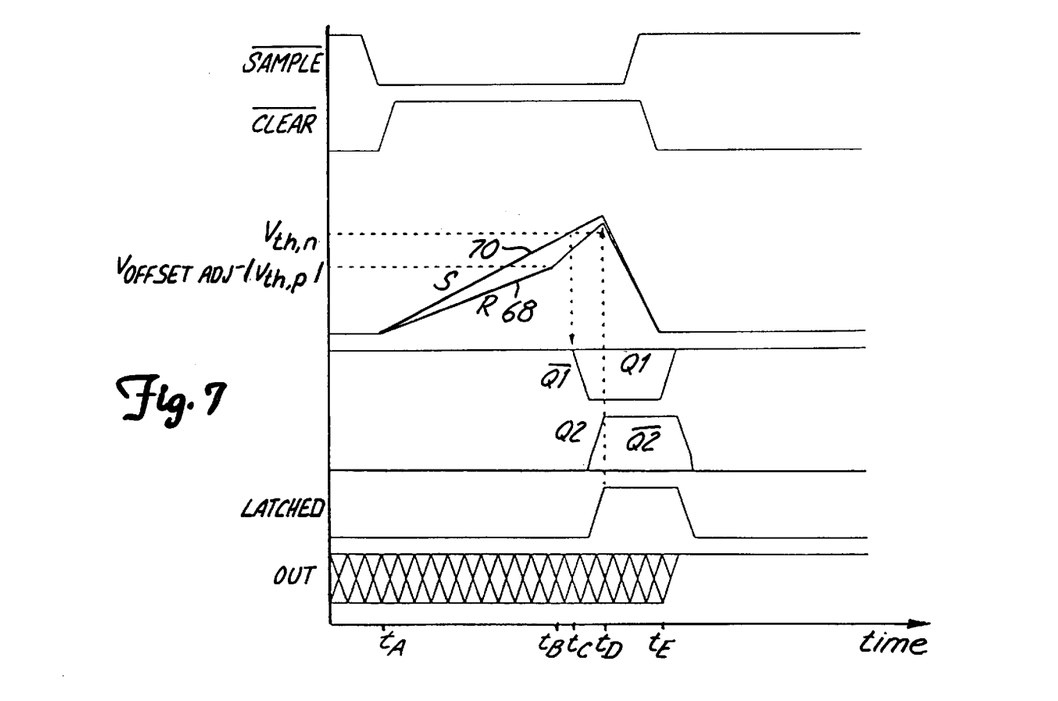

The sequential operation of latching comparator 12A,12B and the effect of the offset adjustment are shown in more detail in FIGS. 6 and 7. FIG. 6 is a waveform diagram illustrating various nodes in latching comparator 12A,12B when the voltage $V_{OFFSETADJ}$ applied to offset adjustment input OFFSETADJ is set too low. A too-low voltage $V_{OFFSETADJ}$ results in Q2=Q3=0 when $V_{IN+}=V_{IN-}$. A sample sequence begins at time $t_A$ with the falling edge of sample input $\overline{\text{SAMPLE}}$. Since $V_{IN+}=V_{IN-}$, approximately equal currents flow through transistors M3 and M4 (shown in FIG. 4). These currents are integrated onto nodes 68 and 70. Transistor M6 is a depletion-mode FET. With $V_{GS,M6}>0$, transistor M6 is in accumulation, and its gate capacitance is relatively constant and approximately equal to:

$$\left(\frac{\varepsilon_0 A_{M6}}{t_{ox}}\right) \qquad \text{Eq. 3}$$

where $\varepsilon_0$ is the dielectric constant of the gate oxide layer of transistor M6, $A_{M6}$ is the gate area of transistor M6 and $t_{OX}$ is the gate oxide thickness. From time $t_A$ to time $t_B$, the channel of transistor M5 is inverted, and its gate capacitance is relatively constant and approximately equal to:

$$\frac{\varepsilon_0 A_{M5}}{t_{ox}} \qquad \text{Eq. 4}$$

where $A_{M5}$ is the gate area of transistor M5. In one embodiment, $A_{M5}=2A_{M6}$. Node 68 therefore rises slower than node 70 in the time interval from time $t_A$ to time $t_B$. At time $t_B$, transistor M5 turns off, its channel depletes, and its gate capacitance drops to zero. Node 68 then rises faster than node 70 after time $t_B$.

Depending on whether node 68 or 70 reaches the N-channel threshold voltage $V_{TH,N}$ first, RS latch 60 will latch a zero or a one on latch output Q2. In the example shown in FIG. 6, with $V_{IN+}=V_{IN-}$, latching comparator 12A,12B favors latching a logic low state on comparator output OUT because $V_{OFFSETADJ}$ is set too low. With $V_{OFFSETADJ}$ set too low, node 68 reaches the threshold first at time $t_C$, pulling internal latch node Q1 low. With node Q1 low, LATCHED goes high at time $t_D$. Transistors M7 and M8 turn on and arrest the rising voltages on nodes 68 and 70 by pulling the nodes low toward the voltage on supply terminal VSS.

On the rising edge of $\overline{\text{SAMPLE}}$, transistors M9 and M10 turn on, holding nodes 68 and 70 low in a balanced state. After $\overline{\text{SAMPLE}}$ transitions from low to high, $\overline{\text{CLEAR}}$ goes low at time $t_E$, which turns on transistors M19 and M20. Transistors M19 and M20 clear latch 60 by pulling internal latch nodes Q1 and $\overline{\text{Q1}}$ high. Also, LATCHED goes low, turning off transistor M12. This eliminates the influence of the current comparator and latch states on the outcome of the next sample phase. Also on the rising edge of $\overline{\text{SAMPLE}}$, D-type flip-flop 62 clocks the logic low state on latch output Q2 to comparator output OUT and holds it until the next rising edge of $\overline{\text{SAMPLE}}$.

FIG. 7 is a timing diagram similar to FIG. 6, but with $V_{OFFSETADJ}$ set too high. Latching comparator 12A,12B now favors latching a logic high state on comparator output OUT when $V_{IN+}=V_{IN-}$. With $V_{OFFSETADJ}$ set too high, node 70 at set input S reaches the N-channel threshold voltage $V_{TH,N}$ first at time $t_C$, turning on transistor M14. Transistor M14 pulls internal latch node $\overline{\text{Q1}}$ low, which results in a logic high state on latch output Q2 and comparator output OUT. LATCHED goes high at time $t_D$, turning on transistor M12. Transistor M12 reinforces the latched state by pulling and holding node $\overline{\text{Q1}}$ low through transistors M11 and M16.

By adjusting $V_{OFFSETADJ}$ when $V_{IN+}=V_{IN-}$ until latching comparator 12A,12B is equally likely to latch a logic high state and a logic low state, the comparator's input offset voltage can be completely nulled out.

An advantage of the latching comparator shown in FIGS. 4 and 5 is that it allows for filtering of high frequency noise. By integrating the current flowing through transistors M3 and M4 onto nodes 68 and 70 from time $t_A$ to time $t_C$, a first-order low-pass filter function results. The total integration time and thus the filter cut-off frequency is controllable by adjusting the bias voltage applied to transistor $M_1$ and thus the tail current ITAIL. The tail current ITAIL must be large enough such that $t_C-t_A$ is less than the low duration of $\overline{\text{SAMPLE}}$, which is nominally half the sample period. This filter can thus be used to filter noise or undesirable signals at frequencies above two times the sampling frequency.

Another advantage of the latching comparator shown in FIGS. 4 and 5 is that it allows for a very low input capacitance, as compared to traditional auto-zeroed latching comparators. Elimination of the traditional track/hold circuitry at the latching comparator input results in an input capacitance that is equal to the gate capacitance of transistor M3 for the IN– input or the gate capacitance of transistor M4 for the IN+ input only. There is no sampling capacitor which would otherwise result in a higher comparator input capacitance due to parasitic coupling of the sampling capacitor to the substrate.

The latching comparator shown in FIGS. 4 and 5 is one example of a comparator that can be used with the present invention. Other latching comparators having offset adjustment inputs can be used in alternative embodiments.

The A/D converter of the present invention allows for repeated and systematic adjustment of the input offset voltage of a sampling comparator such that the offset voltage is reduced to zero. Relative to methods that store and invert this offset voltage on a capacitor in series with input signal path, the present invention is superior in that the capacitor that stores a voltage representative of the offset measurement ($V_{OFFSETADJ}$) is not in series with the signal path. This results in a higher attainable sampling rate, a lower input capacitance and lower power. A disadvantage is that the latching comparator must operate at two times the effective sampling rate of the A/D converter. In other words, for the A/D converter to operate at 100 megasamples per second, the comparator must operate at 200 megasamples per second. By duplicating the latching comparator, as described with reference to FIG. 1, this disadvantage is eliminated. In addition, the A/D converter of the present invention has no device matching requirements, and minimum device geometries can be used.

Although the present invention has been described with reference to preferred embodiments, workers skilled in the art will recognize that changes may be made in form and detail without departing from the spirit and scope of the invention. For example, the entire circuit or portions of the circuit can be logically inverted. The present invention can be implemented with MOS technology or with various other technologies. The terms "pull-up" and "pull-down" used in the specification and in the claims are arbitrary terms and can refer to either a logic high level or a logic low level depending on the convention adopted and the relative states of the supply terminals. Likewise, individual signals can be active high or active low, and corresponding circuitry can be inverted to suit a particular convention. The term "coupled" can include various types of connections or couplings and can include a direct connection or a connection through one or more intermediate components.

What is claimed is:

1. A method of converting an analog input signal to a digital output signal, the method comprising:

operating a first latching comparator in an offset adjustment mode and in a conversion mode over a plurality of sampling cycles, wherein the first latching comparator has a first and second integration time constants;

when the first latching comparator is in the offset adjustment mode, comparing a reference voltage to the reference voltage with the first latching comparator and adjusting one of the first and second integration time constants relative to the other of the first and second integration time constants based on the comparison;

when the first latching comparator is in the conversion mode, comparing the input signal to the reference voltage with the first latching comparator and generating the digital output signal based on the comparison; and repetitively switching the first latching comparator between the offset adjustment mode and the conversion mode.

2. The method of claim 1 wherein the step of repetitively switching comprises alternating the first latching comparator between the offset adjustment mode and the conversion mode in successive ones of the sampling cycles.

3. The method of claim 1 wherein the step of repetitively switching comprises switching the first latching comparator from the conversion mode to the offset adjustment mode after operating the first latching comparator in the conversion mode for a predetermined number of the sampling cycles.

4. The method of claim 1 and further comprising:

operating a second latching comparator in the offset adjustment mode when the first latching comparator is in the conversion mode and operating the second latching comparator in the conversion mode when the first latching comparator is in the offset adjustment mode, wherein the second comparator has a third and fourth integration time constants;

when the second comparator is in the offset adjustment mode, comparing the reference voltage to the reference voltage with the second comparator and adjusting one of the third and fourth integration time constants relative to the other of the third and fourth integration time constants based on the comparison; and when the second comparator is in the conversion mode, comparing the input signal to the reference voltage with the second comparator and generating the digital output signal based on the comparison.

5. The method of claim 4 and further comprising:

generating a first conversion output with the first latching comparator when the first latching comparator is in the conversion mode;

generating a second conversion output with the second comparator when the second comparator is in the conversion mode; and multiplexing between the first and second conversion outputs in successive ones of the sampling cycles to generate the digital output signal.

6. The method of claim 1 wherein the step of adjusting comprises:

generating a first offset measurement output with the first latching comparator during each of the sample cycles in which the first latching comparator is in the offset adjustment mode;

incrementally increasing or decreasing a first offset control voltage on a storage capacitor as a function of a logic state of the first offset measurement output; and adjusting one of the first and second integration time constants as a function of the first offset control voltage.

7. The method of claim 6 wherein:

the step of incrementally increasing or decreasing the first input offset control voltage comprises pumping charge on to or off of the storage capacitor as a function of the logic state of the first offset comparison output; and the step of adjusting one of the first and second integration time constants comprises adjusting one of the first and second integration time constants as a function of the charge pumped on to or off of the storage capacitor.

8. The method of claim 1 wherein the step of adjusting one of the first and second integration time constants comprises adjusting an integration capacitance of one of the first and second latch inputs relative to an integration capacitance of the other of the first and second latch inputs.

9. The method of claim 1 wherein the first latching comparator comprises first and second comparator inputs and wherein the step of comparing a reference voltage to the reference voltage comprises:

supplying a first tail current;

steering the first tail current onto first and second integration nodes as a function of a relative voltage level on the first comparator input as compared to a voltage level on the second comparator input;

generating a latched comparison output as a function of the tail current that is steered onto the first and second integration nodes; and adjusting an integration time constant of the first integration node relative to an integration time constant of the second integration node as a function of the latched comparison output.

10. An analog-to-digital (A/D) converter comprising:

an analog input;

a reference voltage input;

a digital output;

a first latching comparator comprising a first comparator input which is coupled to the reference voltage input, a second comparator input, a first input offset adjustment input which controls a first integration time within the first latching comparator and a first comparator output which is coupled to the digital output;

a first switch circuit coupled between the second comparator input, the reference voltage input and the analog input and having a first switch state in which the second comparator input is coupled to the reference voltage input and a second switch state in which the second comparator input is coupled to the analog input; and a first feedback circuit which is coupled between the first comparator output and the first offset adjustment input, is enabled when first switch circuit is in the first switch state, and is disabled when first switch circuit is in the second switch state.

11. The A/D converter of claim 10 and further comprising:

a second latching comparator comprising a third comparator input which is coupled to the reference voltage input, a fourth comparator input, a second offset adjustment input which controls second integration time within the second latching comparator and a second comparator output which is coupled to the digital output;

a second switch circuit coupled between the fourth comparator input, the reference voltage input and the analog input and having the first switch state in which the fourth comparator input is coupled to the analog input and the second switch state in which the second comparator input is coupled to the reference voltage input; and a second feedback circuit which is coupled between the second comparator output and the second offset adjustment input, is enabled when second switch circuit is in the second switch state, and is disabled when second switch circuit is in the first switch state.

12. The A/D converter of claim 11 and further comprising:

a clock generator having a first clock output; and a multiplexer having a first input coupled to the first comparator output, a second input coupled to the second comparator output, a select input coupled to the first clock output and a multiplexed output coupled to the digital output.

13. The A/D converter of claim 10 and further comprising:

a clock generator having first and second complementary clock outputs; and wherein the first switch circuit comprises:

a first analog switch coupled between the second comparator input and the analog input and having a control terminal coupled to the first clock output; and a second analog switch coupled between the second comparator input and the reference voltage input and having a control terminal coupled to the second clock output.

14. The A/D converter of claim 10 wherein the first latching comparator further comprises:

first and second current integration nodes having first and second integration capacitances, respectively;

a current source which supplies a first tail current;

a current steering circuit coupled to the current source and the first and second comparator inputs, which steers the first tail current onto the first and second current integration nodes as a function of a relative voltage level on the first comparator input as compared to a voltage level on the second comparator input;

offset adjustment means between the first offset adjustment input and the first current integration node for adjusting the first integration capacitance relative to the second integration capacitance as a function of an offset adjustment voltage applied by the feedback circuit to the first offset adjustment input; and a regenerative set-reset latch circuit coupled to the first and second current integration nodes and providing a latched comparison output.

15. The A/D converter of claim 10 wherein:

the latching comparator generates a comparison signal on the first comparator output which has a logic state that depends on a comparison of a voltage on the first comparator input with a voltage on the second comparator input; and the feedback circuit comprises means for applying an offset adjustment voltage to the first offset adjustment input and adjusting the offset adjustment voltage as a function of the logic state of the first comparator output when the feedback circuit is enabled.

16. The A/D converter of claim 15 wherein the means for applying an offset adjustment voltage comprises a charge pump.

17. The A/D converter of claim 10 and further comprising:

a clock generator having first and second complementary clock outputs and a third clock output which is twice the frequency of the first and second clock outputs;

a first D-type latch having a data input coupled to the first comparator output, a data output and an enable input coupled to the third clock output;

a second D-type latch having a data input coupled to the data output of the first D-type latch, a data output, and an enable input coupled to the second clock output;

wherein the feedback circuit comprises a charge pump having a pump direction input coupled to the data output of the second D-type latch, a clock input coupled to the first clock output and an offset adjustment output coupled to the first offset adjustment input;

wherein the first latching comparator further comprises a sample enable input coupled to the first clock output; and wherein the first switch circuit comprises:

a first analog switch coupled between the second comparator input and the analog input and having a control terminal coupled to the first clock output; and a second analog switch coupled between the second comparator input and the reference voltage input and having a control terminal coupled to the second clock output.

18. An analog-to-digital (A/D) converter for converting an analog input signal to a digital output signal, the A/D converter comprising:

a reference voltage input for receiving a reference voltage;

latching comparator means for comparing the reference voltage signal with the reference voltage in a first sampling mode, generating an offset measurement signal as a function of the comparison made in the first sampling mode, comparing the analog input signal with the reference voltage in a second sampling mode, and generating a conversion signal as a function of the comparison made in the second sampling mode;

offset control means for incrementally increasing and decreasing an offset control signal as a function of a logic state of the offset measurement signal during the first sampling mode;

means for adjusting an integration time constant of the latching comparator means as a function of the offset control signal;

output means for generating the digital output signal as a function of the conversion output in the second sampling mode; and means for repetitively switching the latching comparator means between the first and second sampling modes.

19. An analog-to-digital (A/D) converter comprising:

an analog input;

a reference voltage input;

a digital output;

a latching comparator comprising a first comparator input which is coupled to the reference voltage input, a second comparator input, a first input offset adjustment input and a comparator output which is coupled to the digital output, wherein the latching comparator generates a comparison signal on the comparator output which has a logic state that depends on a comparison of a voltage on the first comparator input with a voltage on the second comparator input;

a first switch circuit coupled between the second comparator input, the reference voltage input and the analog input and having a first switch state in which the second comparator input is coupled to the reference voltage input and a second switch state in which the second comparator input is coupled to the analog input; and a first feedback circuit which is coupled between the first comparator output and the first offset adjustment input, is enabled when first switch circuit is in the first switch state, and is disabled when first switch circuit is in the second switch state, wherein the feedback circuit comprises a charge pump for applying an offset adjustment voltage to the first offset adjustment input and adjusting the offset adjustment voltage as a function of the logic state of the first comparison signal when the feedback circuit is enabled.

* * * * *